(12) United States Patent
Rupich (10) Patent No.: US 11,657,930 B2
(45) Date of Patent: May 23, 2023

(54) HIGH TEMPERATURE SUPERCONDUCTING WIRES HAVING INCREASED ENGINEERING CURRENT DENSITIES

(71) Applicant: American Superconductor Corporation, Ayer, MA (US)

(72) Inventor: Martin W. Rupich, Framingham, MA (US)

(73) Assignee: American Superconductor Corporation, Ayer, MA (US)

( * ) Notice: Subject to any disclaimer, the term of this patent is extended or adjusted under 35 U.S.C. 154(b) by 134 days.

(21) Appl. No.: 16/925,268

(22) Filed: Jul. 9, 2020

(65) Prior Publication Data

US 2020/0350101 A1    Nov. 5, 2020
US 2020/0350101 A1    Nov. 5, 2020

Related U.S. Application Data

(62) Division of application No. 15/593,835, filed on May 12, 2017, now Pat. No. 10,804,010.

(51) Int. Cl.
   *H01B 12/14*    (2006.01)
(52) U.S. Cl.
   CPC ......... *H01B 12/14* (2013.01); *H10N 60/0324* (2023.02); *H10N 60/0521* (2023.02);
   (Continued)
(58) Field of Classification Search
   CPC . H01B 12/14; H10N 60/0521; H10N 60/0801
   See application file for complete search history.

(56) References Cited

U.S. PATENT DOCUMENTS 5,801,124 A    9/1998  Gamble et al.
5,987,342 A    11/1999 Scudiere et al.
(Continued)

FOREIGN PATENT DOCUMENTS

| EP | 2234121 A1 | 9/2010 |
| WO | 2011017454 A1 | 2/2011 |
| WO | 2017/151233 A2 | 9/2017 |

OTHER PUBLICATIONS

Solovyov V et al: "Exfoliated YBCO filaments for second-generation superconducting cable", Superconductor Science and Technology, vol. 30, 014006, Nov. 15, 2016 (Nov. 15, 2016), XP020311897, ISSN: 0953-2048, DOI: 10.1088/0953-2048/30/1/014006.
(Continued)

*Primary Examiner* — Paul A Wartalowicz
(74) *Attorney, Agent, or Firm* — Sunstein LLP (57) ABSTRACT

A superconductor wire having a first HTS layer with a first cap layer in direct contact with a first surface of the first HTS layer and a second cap layer in direct contact with a second surface of the first HTS layer. There is a first lamination layer affixed to the first cap layer and a stabilizer layer having a first surface affixed to the second cap layer. There is a second HTS layer and a third cap layer in direct contact with a first surface of the second HTS layer and a fourth cap layer in direct contact with a second surface of the second HTS layer. There is a second lamination layer affixed to the fourth cap layer. The second surface of the stabilizer layer is affixed to the third cap layer and there are first and second fillets disposed along a edge of the laminated superconductor.

10 Claims, 6 Drawing Sheets

(52) U.S. Cl.
CPC ....... *H10N 60/0801* (2023.02); *H10N 60/203* (2023.02); *H10N 60/857* (2023.02)

(56) References Cited

U.S. PATENT DOCUMENTS

| | | | |
|---|---|---|---|
| 6,110,606 | A | 8/2000 | Scudiere et al. |
| 6,230,033 | B1 | 5/2001 | Scudiere et al. |
| 6,444,917 | B1 | 9/2002 | Scudiere et al. |
| 6,784,562 | B2 | 8/2004 | Gennesseaux |
| 8,791,052 | B2 | 7/2014 | Tanner et al. |
| 10,128,026 | B2 | 11/2018 | Na |
| 10,804,010 | B2 | 10/2020 | Rupich |
| 2004/0102329 | A1 | 5/2004 | Mele |
| 2005/0159298 | A1 | 7/2005 | Rupich et al. |
| 2006/0073977 | A1 | 4/2006 | Xie |
| 2007/0264796 | A1* | 11/2007 | Stocker ............. H01L 21/76254 438/455 |
| 2009/0137400 | A1* | 5/2009 | Hahakura ............. H01L 39/143 428/457 |
| 2009/0298696 | A1* | 12/2009 | Otto ......................... H01L 39/02 174/125.1 |
| 2011/0287943 | A1 | 11/2011 | Fukushima |
| 2013/0196857 | A1 | 8/2013 | Mukoyama |
| 2013/0316908 | A1 | 11/2013 | Fukushima |
| 2015/0248952 | A1 | 9/2015 | Ko et al. |
| 2015/0279519 | A1 | 10/2015 | Huguchi |
| 2016/0351310 | A1* | 12/2016 | Rey ......................... H01L 39/24 |
| 2017/0271651 | A1* | 9/2017 | Behan ................. H01M 4/1395 |
| 2019/0131512 | A1* | 5/2019 | Solovyov ............... H01L 39/143 |

OTHER PUBLICATIONS

International Search Report with Written Opinion, dated Nov. 12, 2018, received in international patent application No. PCT/US2018/032271, 12 pages.

Brookhaven Technology Group, "2G exo-cable" retrieved from internet May 2, 2017: http://brookhaventech.com/technolgies/2g-cable/ (2 pages).

U.S. Appl. No. 62/427,239, filed Nov. 29, 2016, Title of Invention: Reel-to-Reel Exfoliation and Processing of Second Generation Superconductors, First Named Inventor: Vyacheslav Solovyov.

International Search Report and Written Opinion, dated Dec. 1, 2016, received in international patent application No. PCT/US2016/048520, 13 pgs.

Jia Y et al: "Doubling the critical current density of high temperature superconducting coated conductors through proton irradiation", Applied Physics Letters, vol. 103, No. 12, 122601, Sep. 19, 2013.

Strickland N M et al: "Flux pinning by discontinuous columnar defects in 74 MeV Ag-irradiated YBa2Cu3O7 coated conductors", Physica C, vol. 469, No. 23-24, Dec. 1, 2009 (Dec. 1, 2009), pp. 2060-2067.

Strickland N M et al: "Effective Low-Temperature Flux Pinning by Au Ion Irradiation in HTS Coated Conductors", IEEE Transactions On Applied Superconductivity, vol. 25, No. 3, 6600905, Jun. 2015 (Jun. 2015), XP011570375, ISSN:1051-8223.

Yamada Y et al: "Towards the practical PLD-IBAD coated conductor fabrication—Long wire, high production rate and Jc enhancement in a magnetic field", Physica C, vol. 45-448, Jul. 21, 2006 (Jul. 21, 2006), pp. 504-508, XP025120539,ISSN: 0921-4534.

Matsui H et al: "4-fold enhancement in the critical current density of YBa2Cu3O7 films by practical ion irradiation", Applied Physics Letters,vol. 101, No. 23, Dec. 3, 2012 (Dec. 3, 2012), pp. 232601-232601, XP012168271, ISSN: 0003-6951.

Mikhailova C et al: "Radiation resistance and generation of pinning centers in composite HTSC under heavy ion irradiation", Physica Status Solidi C, vol. 10, No. 4, Mar. 5, 2012 (Mar. 5, 2012), pp. 677-680, XP055320932, ISSN: 1862-6351.

Rupich M W et al: "Engineered Pinning Landscapes for Enhanced 2G Coil Wire", IEEE Transactions On Applied Superconductivity, vol. 26, No. 3, 6601904, Mar. 15, 2016 (Mar. 15, 2016), XP011605367, ISSN: 1051-8223.

Brookhaven Technology Group, "2G exo-cable" retrieved from internet May 2, 2017: http://brookhaventech.com/technoloies/2g-cable/ (2 pages).

* cited by examiner

HIGH TEMPERATURE SUPERCONDUCTING WIRES HAVING INCREASED ENGINEERING CURRENT DENSITIES

CROSS-REFERENCE TO RELATED APPLICATIONS

This application is a Division of U.S. application Ser. No. 15/593,835, filed May 12, 2017, entitled "HIGH TEMPERATURE SUPERCONDUCTING WIRES HAVING INCREASED ENGINEERING CURRENT DENSITIES," allowed on Apr. 9, 2020, the contents of which are incorporated herein by reference in its entirety.

FIELD OF INVENTION

The present invention generally relates to long length high temperature superconducting ("HTS") wires and more particularly to such HTS wires having increased engineering current densities.

BACKGROUND

Since the discovery of HTS materials (i.e. material that can retain its superconducting properties above the liquid nitrogen temperature of 77K) there have been efforts to develop various engineering applications using such HTS materials. In thin film superconductor devices and wires, most progress has been made with fabrication of devices utilizing an oxide superconductor including yttrium, barium, copper and oxygen in the well-known basic composition of $YBa_2CuO_{7-y}$ (hereinafter referred to as Y123 or YBCO), which remains the preferred material for many applications, including cables, motors, generators, synchronous condensers, transformers, current limiters, and magnet systems for military, high energy physics, materials processing, transportation and medical uses.

HTS wire based on these YBCO materials, commonly referred to as Coated Conductor or Second Generation (2G) wire has been manufactured in continuous lengths of hundreds of meters or longer with critical current densities, $J_c$, of 3 MA/cm$^2$ or higher at 77 K and self-field using roll-to-roll production lines. The engineering current densities ($J_e$), which take into account the thickness of the substrate and the stabilizer material, of over 8 KA/cm$^2$ have been achieved in long lengths.

To continue to make HTS wire more desirable for various power applications, increasing the engineering current density is very important. Since the architecture of 2G wires, having a substrate with one or more buffer layers on which the HTS layer is disposed has been long established and required for high performance 2G wire, focus has been placed on increasing the $J_c$ to in turn increase $J_e$. As a result, increases in $J_e$ have been somewhat modest as the overall cross-sectional area of the HTS 2G wire have remained stable due to the thickness of the substrate and stabilizer layers.

In addition, certain substrates used in HTS wires, such as nickel tungsten (Ni5W) have magnetic properties and have resulted in less than optimal electrical performance in AC applications. Efforts have focused on reducing the magnetic properties in such substrates by using less magnetic material (e.g. Ni9W), but challenges in maintaining comparable overall electrical performance characteristics have persisted.

Therefore, there exists a need for an HTS wire with increased engineering current density as well as an HTS wire with improved electrical performance in AC applications.

SUMMARY

It is an object of the invention to produce an HTS wire with increased engineering current density.

It is a further object of the invention to produce an HTS wire with improved electrical performance in AC applications.

It is a further object of the invention to produce an HTS wire in which the textured substrate is removed in the wire manufacturing process and is reusable to produce another HTS wire with the removed textured substrate.

In one aspect the invention includes a laminated superconductor wire assembly, comprising a first high temperature superconductor layer having a first surface and a second surface opposite the first surface and a first electrically conductive cap layer overlaying and in direct physical contact with the first surface of the first high temperature superconductor layer. There is a second electrically conductive cap layer overlaying and in direct physical contact with the second surface of the first high temperature superconductor layer and a first lamination layer overlaying and affixed to the first electrically conductive cap layer. There is also a stabilizer layer, having a first surface and a second surface opposite the first surface, the first surface of the stabilizer layer overlaying and affixed to the second electrically conductive cap layer. There is also a second high temperature superconductor layer having a first surface and a second surface opposite the first surface and a third electrically conductive cap layer overlaying and in direct physical contact with the first surface of the second high temperature superconductor layer. There is further a fourth electrically conductive cap layer overlaying and in direct physical contact with the second surface of the second high temperature superconductor layer and a second lamination layer overlaying and affixed to the fourth electrically conductive cap layer. The second surface of the stabilizer layer is overlaying and affixed to the third electrically conductive cap layer and there is included a first fillet disposed along a first edge of the laminated superconductor wire assembly and connected to the first lamination layer and the second lamination layer. There is a second fillet disposed along a second edge of the laminated superconductor wire assembly and connected to the first lamination layer and the second lamination layer.

In other aspects of the invention, one or more of the following features may be included. The first and second high temperature superconductor layers each may comprise a rare earth-alkaline earth-copper oxide. The first, second, third and fourth electrically conductive cap layers may each comprise silver or a silver alloy or a silver layer and copper layer. The first and second lamination layers may each comprise a metal selected from the group of aluminum, copper, silver, nickel, iron, stainless steel, aluminum alloy, copper alloy, silver alloy, nickel alloy, and iron alloy. The first and second lamination layers may have a width that is greater than the width of the first and second high temperature superconductor layers. The width of the first and second lamination layers may be between 0.01 and 2 mm greater than the width of the first and second high temperature superconductor layers. The stabilizer layer may comprise a metal selected from the group of aluminum, copper, silver, nickel, iron, stainless steel, aluminum alloy, copper alloy, silver alloy, nickel alloy, and iron alloy. The second electrically conductive cap layer may be affixed to the first surface of the stabilizer layer via an epoxy or a solder, the fourth electrically conductive cap layer may be affixed to the second surface of the stabilizer layer via an epoxy or a solder, the first lamination may be affixed to the first electrically conductive cap layer via an epoxy or a solder, and the second lamination may be affixed to the fourth electrically conductive cap layer via an epoxy or a solder; and wherein the first and second fillets may be formed of an epoxy or a solder. The epoxy may doped with material to make the epoxy electrically conductive, thermally conductive, or electrically and thermally conductive.

In another aspect the invention features a laminated superconductor wire assembly, comprising a high temperature superconductor layer having a first surface and a second surface opposite the first surface. There is a first electrically conductive cap layer overlaying and in direct physical contact with the first surface of the high temperature superconductor layer. There is also a second electrically conductive cap layer overlaying and in direct physical contact with the second surface of the high temperature superconductor layer and a first lamination layer overlaying and affixed to the first electrically conductive cap layer. There is further included a stabilizer layer, having a first surface and a second surface opposite the first surface, the first surface of the stabilizer layer overlaying and affixed to the second electrically conductive cap layer and a second lamination layer overlaying and affixed to the second surface of the stabilizer layer. There is included a first fillet disposed along a first edge of the laminated superconductor wire assembly and connected to the first lamination layer and the second lamination layer and a second fillet disposed along a second edge of the laminated superconductor wire assembly and connected to the first lamination layer and the second lamination layer.

In yet other aspects of the invention, one or more of the following features may be included. The high temperature superconductor layer may comprise a rare earth-alkaline earth-copper oxide. The first and second electrically conductive cap layers may each comprise silver or a silver alloy or a silver layer and a copper layer. The first and second lamination layers may each comprise a metal selected from the group of aluminum, copper, silver, nickel, iron, stainless steel, aluminum alloy, copper alloy, silver alloy, nickel alloy, and iron alloy. The first and second lamination layers may have a width that is greater than the width of the first and second high temperature superconductor layers. The width of the first and second lamination layers may be between 0.01 and 2 mm greater than the width of the first high temperature superconductor layer. The stabilizer layer may comprises a metal selected from the group of aluminum, copper, silver, nickel, iron, stainless steel, aluminum alloy, copper alloy, silver alloy, nickel alloy, and iron alloy. The second electrically conductive cap layer may be affixed to the first surface of the stabilizer layer via an epoxy or solder, the first lamination may be affixed to the first electrically conductive cap layer via an epoxy or solder and the second lamination may be bonded to the second with the second surface of the stabilizer layer via an epoxy or solder; and the first and second fillets may be formed of an epoxy or a solder. The epoxy may be doped with material to make the epoxy electrically conductive, thermally conductive, or electrically and thermally conductive.

In one aspect the invention includes a method of making a laminated superconductor wire. The method includes providing a first superconductor insert having a first high temperature superconductor layer with a first surface overlaying and in direct physical contact with a first biaxially textured substrate and a first electrically conductive cap layer overlaying and in direct physical contact with a second surface of the first superconductor layer. The method also includes providing a second superconductor insert having a second high temperature superconductor layer with a first surface overlaying and in direct physical contact with a first surface of a second biaxially textured substrate and a second electrically conductive cap layer overlaying and in direct physical contact with a second surface of the second superconductor layer. The method also includes affixing the first electrically conductive cap layer of the first superconductor insert to a first surface of a stabilizer layer and affixing the second electrically conductive cap layer of the second superconductor insert to a second surface of a stabilizer layer opposite the first surface of the stabilizer layer. The method additionally includes removing the first biaxially textured substrate from the first superconductor layer to expose the first surface of the first superconductor layer and removing the second biaxially textured substrate from the second superconductor layer to expose the first surface of the second superconductor layer. The method further includes affixing a third electrically conductive cap layer to the first surface of the first superconductor layer; and affixing a fourth electrically conductive cap layer to the first surface of the second superconductor layer and affixing a first lamination layer to the third electrically conductive cap layer; and affixing a second lamination layer to the fourth electrically conductive cap layer. The step of affixing the first and second lamination layers includes disposing a first fillet along a first edge of the laminated superconductor wire assembly and connected to the first lamination layer and the second lamination layer and disposing a second fillet along a second edge of the laminated superconductor wire assembly and connected to the first lamination layer and the second lamination layer.

In other aspects of the invention, one or more of the following features may be included. The first and second high temperature superconductor layers may each comprise a rare earth-alkaline earth-copper oxide. The first and second biaxially textured substrates may each comprise one of a hastelloy or a nickel alloy. The first and second biaxially textured substrates may each further comprise at least one buffer layer. The first, second, third and fourth electrically conductive cap layers may each comprise silver or a silver alloy or a layer of silver and a layer of copper. The first and second lamination layers may each comprise a metal selected from the group of aluminum, copper, silver, nickel, iron, stainless steel, aluminum alloy, copper alloy, silver alloy, nickel alloy, and iron alloy. The first and second lamination layers may have a width that is greater than the width of the first and second high temperature superconductor layers. The width of the first and second lamination layers may be between 0.01 and 2 mm greater than the width of the first and second high temperature superconductor layers. The stabilizer layer may comprises a metal selected from the group of aluminum, copper, silver, nickel, iron, stainless steel, aluminum alloy, copper alloy, silver alloy, nickel alloy, and iron alloy. The second electrically conductive cap layer may be affixed to the first surface of the stabilizer layer via an epoxy or a solder, the fourth electrically conductive cap layer may be affixed to the second surface of the stabilizer layer via an epoxy or a solder, the first lamination may be affixed to the first electrically conductive cap layer via an epoxy or a solder, and the second lamination may be affixed to the second electrically conductive cap layer via an epoxy or solder; and wherein the first and second fillets may be formed of an epoxy or a solder. The method may also include reusing the first and second biaxially textured substrates removed from the first and second superconductor layers to produce two superconductor inserts each having a high temperature superconductor layer with a surface overlaying and in direct contact with one of the removed first and second biaxially textured substrates.

In yet another aspect the invention includes a method of making a laminated superconductor wire, the method comprising providing a superconductor insert having a high temperature superconductor layer with a first surface and a second surface opposite the first surface. The first surface overlaying and in direct contact with a biaxially textured substrate and a first electrically conductive cap layer overlaying and in direct physical contact with a second surface of the superconductor layer. The method includes affixing the first electrically conductive cap layer of the superconductor insert to a first surface of a stabilizer layer and removing the biaxially textured substrate from the first superconductor layer to expose the first surface of the first superconductor layer. The method also includes affixing a third electrically conductive cap layer to the first surface of the superconductor layer, affixing a first lamination layer to the second electrically conductive cap layer and affixing a second lamination layer to a second surface of the stabilizer layer. The step of affixing the first and second lamination layers includes disposing a first fillet along a first edge of the laminated superconductor wire assembly and connected to the first lamination layer and the second lamination layer and disposing a second fillet along a second edge of the laminated superconductor wire assembly and connected to the first lamination layer and the second lamination layer.

In yet further aspects of the invention, one or more of the following features may be included. The high temperature superconductor layer may comprise a rare earth-alkaline earth-copper oxide. The biaxially textured substrate may comprises one of a hastelloy or a nickel alloy. The biaxially textured substrate may further comprise at least one buffer layer. The first and second electrically conductive cap layers may each comprise silver or a silver alloy or a layer of silver and a layer of copper. The first and second lamination layers may each comprise a metal selected from the group of aluminum, copper, silver, nickel, iron, stainless steel, aluminum alloy, copper alloy, silver alloy, nickel alloy, and iron alloy. The first and second lamination layers may have a width that is greater than the width of the high temperature superconductor layer. The width of the first and second lamination layers may be between 0.01 and 2 mm greater than the width of the high temperature superconductor layer. The stabilizer layer may comprise a metal selected from the group of aluminum, copper, silver, nickel, iron, stainless steel, aluminum alloy, copper alloy, silver alloy, nickel alloy, and iron alloy. The second electrically conductive cap layer may be affixed to the first surface of the stabilizer layer via an epoxy or solder, the first lamination may be bonded to the first electrically conductive cap layer via an epoxy or solder, and the second lamination may be bonded to the second with the second surface of the stabilizer layer via an epoxy or solder and the first and second fillets may be formed of an epoxy or a solder. The method may further include reusing the biaxially textured substrate removed from the first superconductor layer to produce a superconductor insert having a high temperature superconductor layer with a surface overlaying and in direct contact with the removed biaxially textured substrate.

Additional features, advantages, and embodiments of the present invention may be set forth from consideration of the following detailed description, drawings, and claims. Moreover, it is to be understood that both the foregoing summary of the present disclosure and the following detailed description are exemplary and intended to provide further explanation without further limiting the scope of the present disclosure claimed.

DETAILED DESCRIPTION

Figure 1:
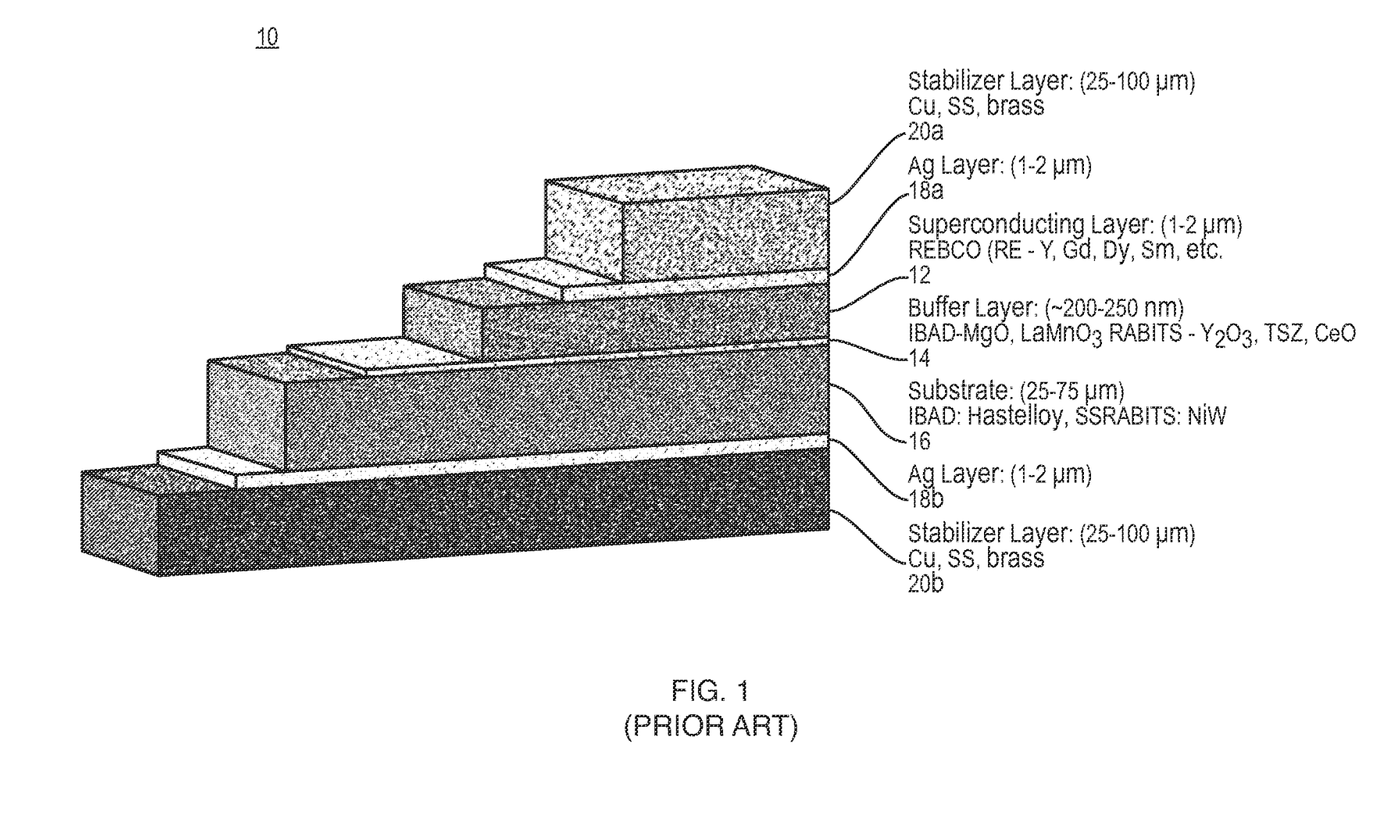
FIG. 1 shows the architecture of a prior art 2G HTS wire.

An exemplary architecture of a prior art HTS wire 10 is depicted in FIG. 1. In this architecture, HTS wire 10 includes a polycrystalline superconductor layer 12 disposed over and supported by a substrate 16, between which are one or more buffer layers 14. The substrate 16 comprises a flexible metal foil which may be formed of any suitable metal containing material. According to one embodiment, the flexible metal substrate is a nickel containing alloy, such as a nickel tungsten alloy.

The substrate 16 may include texture that is transferred to the superconductor layer 12. As described herein, texture refers to a microstructure including crystal plane alignment. A high degree of crystal plane alignment in the superconductor layer allows the polycrystalline superconductor layer 12 to exhibit single crystal-like performance. The textured substrate 16 may be a flexible metal film with one of the other layers described above. Alternatively, the textured substrate 16 may be a separate layer within the coated conductor.

The textured substrate 16 may be produced by any appropriate process. According to one embodiment, the textured substrate 16 may be produced by a rolling-assisted biaxially textured substrate (RABiTS) process. The RABiTS process includes the production of a biaxially textured metal foil by a rolling assisted process. At least one oxide buffer layer 14 is then provided on the textured metal substrate 16, with the oxide buffer layer exhibiting the same biaxially textured microstructure as the metal substrate. A biaxially textured high temperature superconductor layer 12 is then deposited over the oxide buffer layer(s) 14. The oxide buffer layer 14 prevents the diffusion of metal from the film to the superconductor layer.

According to another embodiment, the textured substrate may be produced by a process utilizing ion-beam assisted deposition (IBAD). The IBAD process includes the ion-beam assisted deposition of a textured ceramic buffer layer on the surface of an un-textured metal foil. A superconductor layer is then deposited over the textured ceramic buffer layer. Additional buffer layers may be provided between the textured ceramic buffer layer and the superconductor layer and/or between the metal film and the textured ceramic buffer layer. The IBAD coated conductor includes a metal film substrate, a textured ceramic oxide buffer layer, oxide buffer layers, a superconductor layer, a metallic protective layer and a stabilizer layer.

The superconductor layer may be deposited over the substrate of the coated conductor structure by any suitable process. According to one embodiment, the superconductor layer may be deposited by a metal-organic deposition process. According to another embodiment, the superconductor layer may be deposited by a pulsed laser deposition (PLD), reactive co-evaporation (RCE), metal-organic chemical vapor deposition (MOCVD), electron beam deposition, chemical vapor deposition (CVD), or sputtering process. The superconductor layer may have any appropriate thickness. According to one embodiment, the superconductor layer has a thickness greater than 1 µm. In another embodiment, the superconductor layer has a thickness in the range of about 1 µm to about 2 µm. According to some embodiments, the superconductor may have a thickness of less than about 5 µm.

As is known in the field, HTS wire 10 also may include a metallic protective layer 18a, such as an Ag layer, disposed on superconductor layer 12 and a stabilizer layer 20a disposed on the metallic layer 18a. HTS wire 10 may also include a metallic protective layer 18b, such as an Ag layer, disposed on a surface of substrate 16 opposite the surface on which the buffer layers 14 are disposed. And, stabilizer layer 20b may be disposed on the metallic layer 18b. The protective layer and the stabilizer layer may be referred to herein in combination as a cap layer.

The protective metal layers (or cap layers) 18a/18b are deposited over the superconductor layer 14 and the substrate 16 for the purpose of protecting the superconductor layer/substrate and may be any suitable metal containing material. According to one embodiment, the protective metal layer is a silver layer. The protective layer may have any appropriate thickness. According to one embodiment, the protective layer has a thickness of 3 µm. According to another embodiment the protective layer has a thickness of about 1 µm. According to another embodiment the protective layer has a thickness of about 0.5 µm.

According to one embodiment the stabilizer layers 20a/20b may include any suitable metal containing material and may have a thickness greater than 25 µm. In another embodiment the stabilizer layers may have thicknesses of 10 to 25 µm. In another embodiment the stabilizer layers may have thicknesses of about 0.5 µm. In one embodiment the stabilizer layers are copper. In other embodiments, the stabilizer layers are stainless steel, brass or any other suitable metal containing material. In one embodiment, the width of the stabilizer layers are the same as that of the HTS layer 12. In another embodiment, the width of the stabilizer layers are greater than that of the HTS layer 12. In another embodiment, the stabilizer layer can wrap around all sides of the HTS wire 10.

The superconductor layer 12 may be formed of any appropriate superconductor. According to one embodiment the superconductor layer may be a rare earth metal-alkaline earth metal-transition metal-oxide superconductor. According to one embodiment, the superconductor layer 12 may contain a superconductor with the general formula:

$$(RE)Ba_2Cu_3O_{7-\delta}$$

where RE includes at least one rare earth metal and $0 \leq \delta \leq 0.65$. According to another embodiment, the superconductor layer may contain a superconductor with the general formula:

$$(RE)Ba_2Cu_3O_7$$

where RE includes at least one rare earth metal. In one embodiment, RE may include yttrium, producing a superconductor layer of the general formula $YBa_2Cu_3O_7$ (YBCO). While the superconductor layer will be referred to herein as a YBCO superconductor layer for the purposes of convenience, the methods discussed in this application apply equally to other appropriate superconductor materials. In some cases, RE may be a mixture of two or more rare earth metals.

The superconductor layer 12 may also include a dopant in addition to the primary rare earth metal. The dopant may be a rare earth metal. According to one embodiment, a YBCO superconductor layer may include a dysprosium dopant. The dopant may be present in an amount of up to 75% relative to the primary rare earth metal. According to one embodiment, the dopant is present in an amount of at least about 1% and at most about 50% of the primary rare earth metal. According to another embodiment the dopant may be a transition metal such as Zr, Nb, Ta, Hf or Au. The dopant may combine with other elements in the superconductor to form a single or mixed metal oxide.

In one embodiment, the HTS wire 10 may be sectioned along its length in to multiple strips. The sectioning may be done by any appropriate means including laser cutting, roll slitting or punching. Moreover, after the HTS wire 10 is sectioned along its length into multiple strips, the strips may then be sandwiched between laminations on the outer surfaces of the stabilizer layers 20a and 20b, as described below.

By including the laminations as well as the stabilizer layers 20a and 20b, the HTS wire structure is suitably reinforced mechanically and has been provided with electrical paths from the HTS layer 12 so that it is electrically stabilized. It is therefore configured to be directly utilized in an electrical power application such as in a HTS power cable, for example. In certain cases, all that is desired is the so-called "insert" wire which comprises the HTS wire structure of FIG. 1 without the laminations layers. As will be described below, HTS wire according to this invention is constructed from the HTS insert (less metallic layer 18b and stabilizer 20b) as a starting point in the process.

Figure 2:
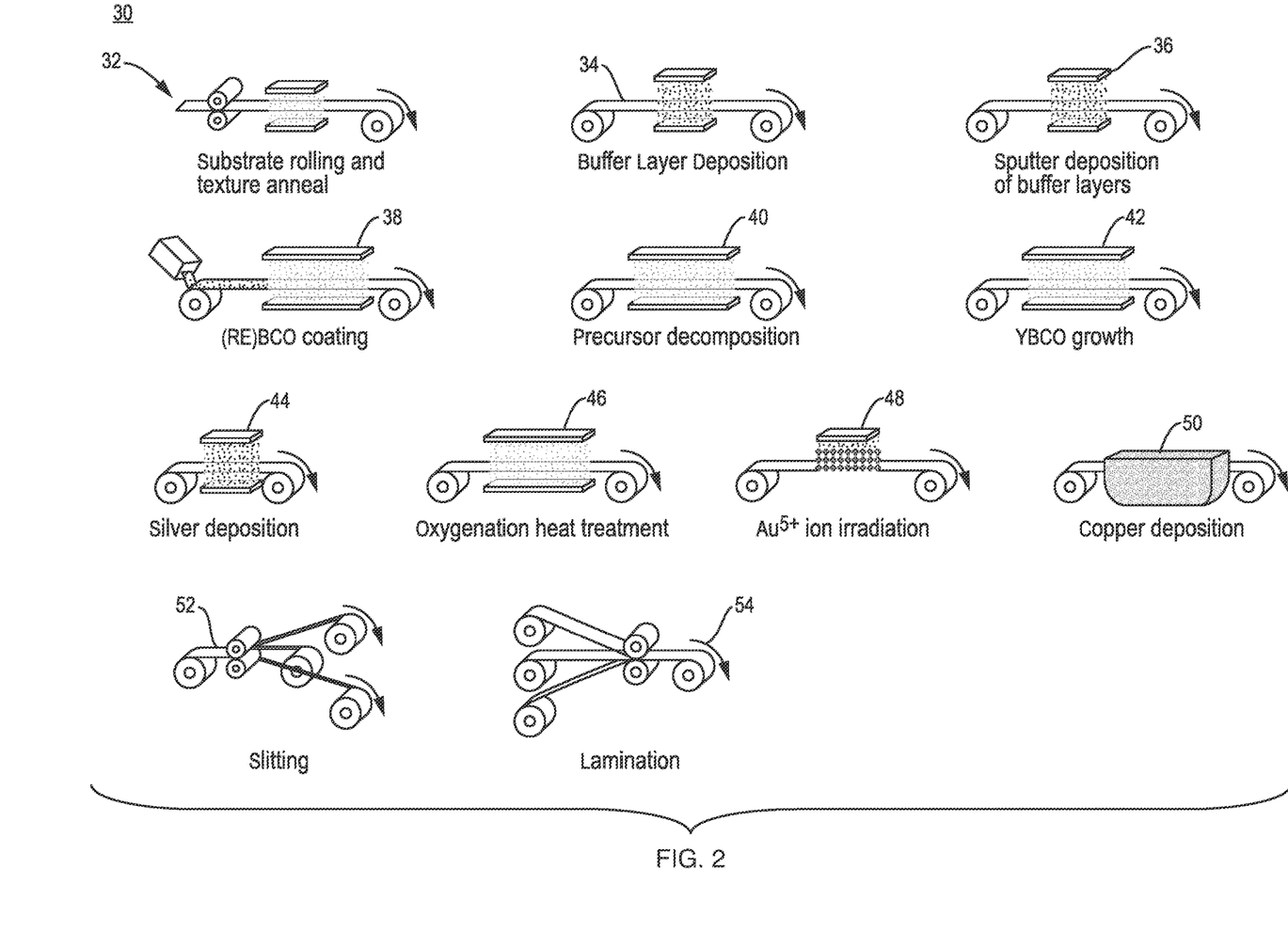
FIG. 2 illustrates a prior art reel-to-reel process for manufacturing the 2G HTS wire of FIG. 1 by the RABiTS/MOD process.

In FIG. 2, a roll-to-roll manufacturing process 30 for producing a superconducting wire, such as HTS wire 10, FIG. 1, using a RABiTS substrate for the template and MOD process for the YBCO layer is shown. The process includes substrate rolling and texture annealing at process step 32 to produce a substrate such as substrate 16, FIG. 1, buffer layer deposition and sputter buffer deposition of buffer layers are shown in steps 34 and 36, respectively, which produce buffer layers, such as buffer layers 14 of FIG. 1. At steps 38, 40 and 42 the HTS layer (e.g. HTS layer 12, FIG. 1) is deposited by coating the buffered substrate with a solution based (RE) BCO precursor, the precursor is decomposed, and the (RE) BCO layer is grown. Next, at step 44, Ag protective layers (e.g. layers 18a/18b, FIG. 1) are deposited on the HTS layer and the substrate and at step 46 there is an oxygenation heat treatment performed. An optional step in the process is an ion irradiation step 48 which may be used to produce a uniform distribution of pinning microstructures in the HTS layer to improve electrical performance, in particular in applied magnetic fields. This process step is more fully described in published patent application, US 2017/0062098, incorporated herein by reference. At step 50 in the process, stabilizer layers, such as stabilizer layers 20a/20b of FIG. 1, are deposited, followed by slitting and the application of laminations at steps 52 and 54, respectively.

It is understood that individual process steps depicted in FIG. 2 can be replaced when other processes are used for the template, YBCO deposition, or stabilization.

Using the above described basic HTS wire manufacturing process, additional/different processing steps may be incorporated according to this invention to produce a HTS wire with increased engineering current density as well as an HTS wire with improved electrical performance in AC applications. The additional processing steps and the HTS wire architecture are described with regards to FIGS. 3-7 below.

Figure 3:
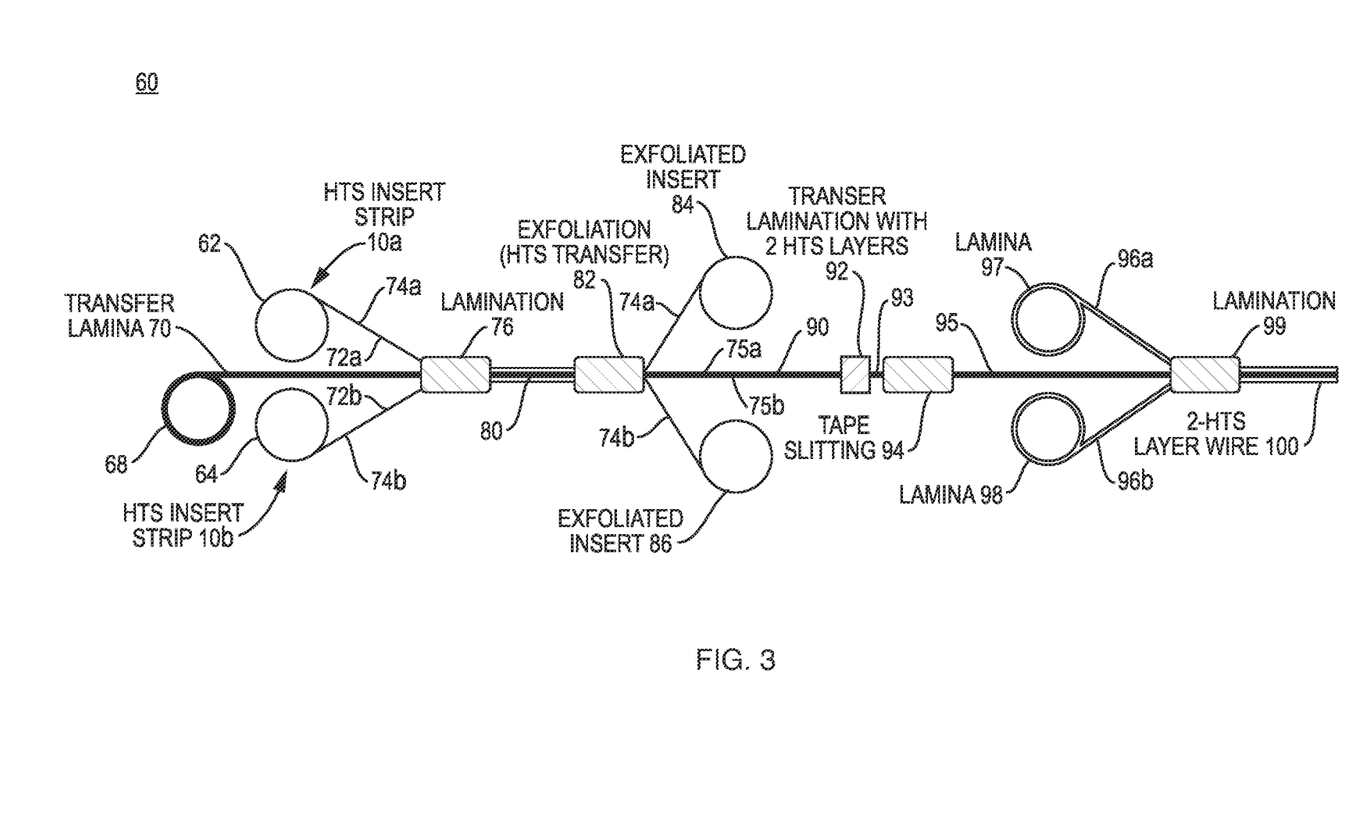
FIG. 3 illustrates a reel to reel process for manufacturing a double sided HTS wire according to an embodiment of this invention.

In FIG. 3, a continuous reel to reel process 60 according to an embodiment of this invention is depicted to include reels 62 and 64 carrying HTS insert wire 10a and 10b, respectively, which may be comparable to the HTS insert wire described above with regard to FIG. 1 (excluding metallic layer 18b and stabilizer 20b). There is an additional reel 68 which carries stabilizer material 70. In one embodiment, the stabilizer material 70 may include any suitable metal containing material and may have a thickness greater than 10 µm. In another embodiment the stabilizer layer may have a thickness of 1 to 2 µm. In one embodiment the stabilizer layer is copper. In other embodiments, stabilizer layer 70 comprises a metal selected from the group of aluminum, copper, silver, nickel, iron, stainless steel, aluminum alloy, copper alloy, silver alloy, nickel alloy, and iron alloy. It should be noted that while process 60 is shown to be a continuous process, the process could alternatively be carried out using two or more individual steps.

HTS insert wire 10a is paid off reel 62 so that its cap layer 72a is facing the top surface of stabilizer material 70. HTS insert wire 10b is paid off reel 64 so that its cap layer 72b is facing the bottom surface of stabilizer material 70. The surfaces opposite of the cap layers 72a and 72b are substrates layers 74a and 74b of HTS insert wires 10a and 10b, respectively. The substrate layers 74a/74b may also include one or more buffer layers. The HTS insert wires 10a and 10b are positioned on either side of stabilizer 70 and the three materials are fed through a joining machine 76 which joins the two HTS insert wires 10a/10b to opposite surfaces of the stabilizer 70 via thin layers of a Sn based solder material to produce a double sided HTS wire structure 80. In another embodiment a thin epoxy, which may be doped with material to make it electrically conductive, thermally conductive, or electrically and thermally conductive, is used to bond the HTS inserts 10a/10b to opposite surfaces of the stabilizer 70.

The double sided HTS wire structure 80 is introduced to exfoliation device 82 causing the substrate layers 74a and 74b, including buffer layers, to be released or exfoliated from each wire 10a and 10b exposing HTS layers 75a and 75b. The exfoliation process relies on the fact that when the two HTS insert strips 10a and 10b are bonded to the stabilizer 70 the weakest interface in the composite strip 80 is between the HTS layer and the oxide buffer layer in the HTS insert strips 10a and 10b. This interface has a very low peel or cleavage stress of <1 MPa. When the composite strip 80 is fed into the exfoliation device 82 the exfoliated inserts 74a and 74b are separated from the HTS layers 75a and 75b on each side of stabilizer 90 by peeling at an angle of between 5 to 85 degrees relative to the surface of stabilizer 90. In an alternate embodiment, the exfoliation can be assisted by introduction of additional stress between inserts 74a and 74b as they are separated from the HTS layers 75a and 75b on each side of stabilizer 90 by heating composite strip 80. In another embodiment, the exfoliation may be assisted by cooling composite strip 80. An exfoliation process was described in a presentation provided by SuNAM Co., LTD. of Korea entitled "Recent Progress on SuNAM's Coated Conductor Development; Performance, Price & Utilizing ways, on Sep. 13, 2016, at Coated Conductors For Applications 2016 (CCA2016) conference in Aspen, Colo., USA.

The exfoliated substrates 74a and 74b are collected on reels 84 and 86 as part of the continuous process 60 leaving composite wire structure 90. Composite wire structure 90 includes cap layers 72a and 72b affixed to the stabilizer 70 and HTS layers 75a and 75 exposed and facing outwardly from the stabilizer layer 70. It should be noted that the exfoliated buffered substrates 74a and 74b may be reused as templates to grow new HTS layers thereon and the HTS wires with the previously used and exfoliated substrates may be fed through the continuous process 60 to be once again exfoliated so that HTS wires according to this invention may be produced. In one embodiment the top biaxially textured oxide buffer layer 14 may be redeposited on the metal substrate 16 before it is used as a template to grow a new HTS layer. In one embodiment the top buffer layer 14 is $CeO_2$.

Cap layers are deposited on the outside surfaces of the HTS layers 75a and 75b of the composite wire structure 90. The cap layers may each comprise silver or a silver alloy or a silver layer and copper layer. In the case of a layer of silver in combination with a layer of copper, two deposition steps would be used. In one embodiment the silver layer may be deposited by a vacuum deposition and the copper layer may be deposited by an electrical chemical deposition process. An example of a silver layer and a copper layer is shown in prior art FIG. 1, as silver layer 18a combined with copper layer 20a.

An optional step in the process is an ion irradiation step 48, FIG. 2, which may be used to produce a uniform distribution of pinning microstructures in the HTS layer to improve electrical performance, in particular in applied magnetic fields. In one embodiment the ion irradiation step 48 may be introduced before the deposition of the silver or silver alloy layer 170. In an alternate embodiment the ion irradiation step 48 may be introduced after the deposition of the silver or silver alloy layer 170.

Composite wire structure 93 with cap layers is fed to wire slitter 94, which slits wire structure 93 using a laser slitter, for example, into a plurality of individual narrower HTS wires 95 that are fed into lamination device 99. Lamination device 99 disposes laminations 96a and 96b, fed from reels 97 and 98, respectively, on the upper and lower surfaces of the slit HTS wires 95 to form a plurality of composite double HTS layer wires 100, according to an embodiment of the invention.

In one embodiment, lamination device 99 is a solder bath which provides a layer a solder to adhere the laminations to composite wire structure 95. It should be noted that lamination layers may each comprise a metal selected from the group of aluminum, copper, silver, nickel, iron, stainless steel, aluminum alloy, copper alloy, silver alloy, nickel alloy, and iron alloy. Also, the lamination layers may have a width that is greater than the HTS layers by between 0.01 and 2 mm.

In an alternative embodiment, lamination device 99 adheres lamination layers 96a/96b to their respective cap layer via an epoxy, which may be doped with material to make the epoxy electrically conductive, thermally conductive, or electrically and thermally conductive.

Figure 4:
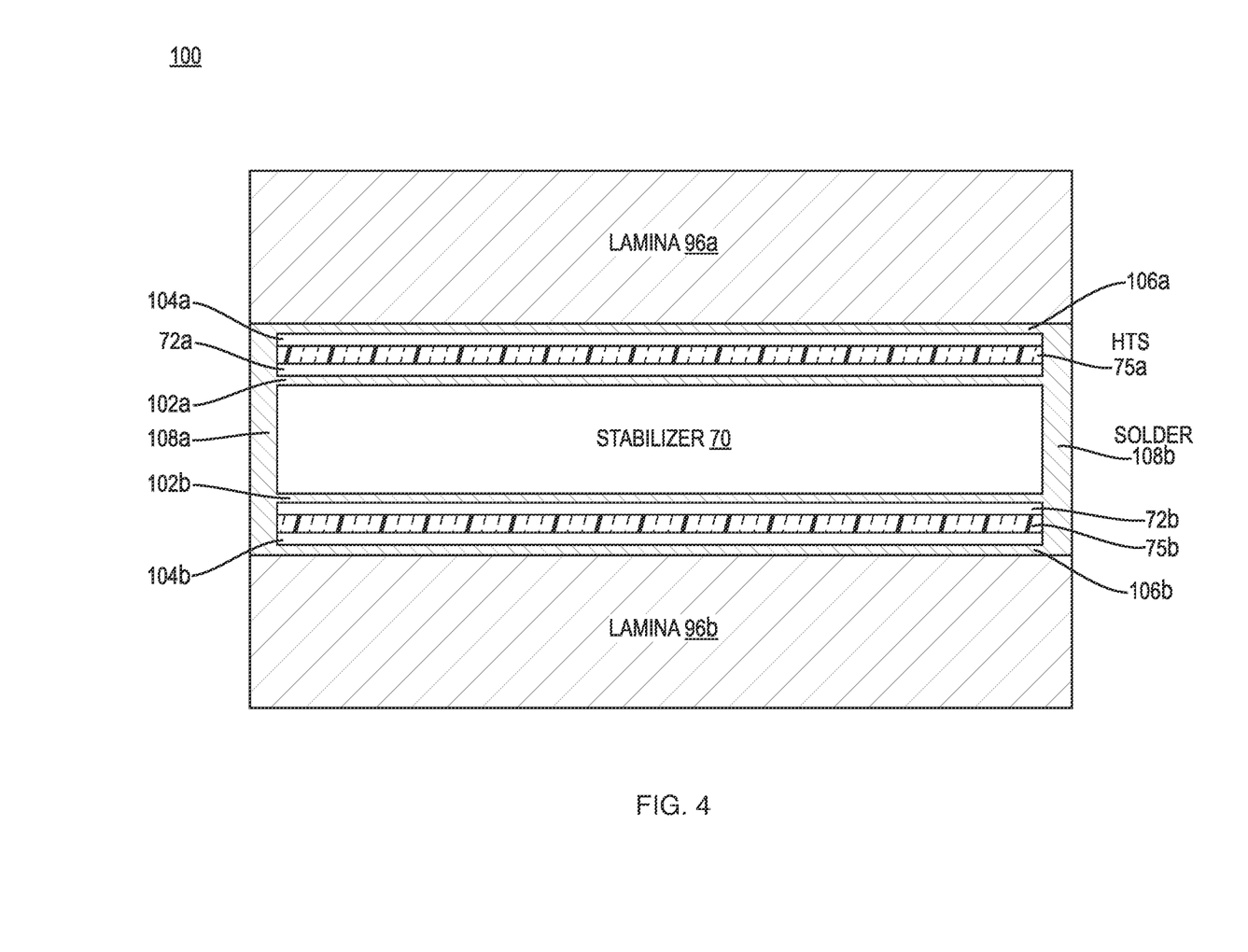
FIG. 4 is a cross-sectional view of a double sided HTS wire manufactured according to the reel to reel process of FIG. 3.

A schematic of the transverse cross-section of double HTS layer wire 100 as shown in FIG. 4 includes a first surface of HTS layer 75a capped by silver/copper cap layer 72a adhered to the upper surface of stabilizer 70 by solder or epoxy layer 102a. Also shown is a first surface of HTS layer 75b capped by silver/copper cap layer 72b adhered to the lower surface of stabilizer 70 by solder or epoxy layer 102b. A second surface, opposite the first surface, of HTS layer 75a capped by cap layer 104a adhered to lamination 96a by solder or epoxy 106a. A second surface, opposite the first surface of HTS layer 75b capped by cap layer 104b adhered to lamination 96b by solder or epoxy 106b. During the lamination process by lamination device 99, FIG. 3, solder or epoxy fillets 108a and 108b are disposed along the length and edges of each of the plurality of wires 100 mechanically and electrically connecting the laminations 96a and 96b.

It should be noted that lamination device 99 may be configured to apply epoxy to adhere the laminations to the cap layers of the HTS wires instead of using solder. Moreover, in that case the fillets 108a/108B along the length and edges of the HTS wires are also formed of epoxy. The epoxy may be doped with material to make the epoxy electrically conductive, thermally conductive, or electrically and thermally conductive Substrate.

As is evident from FIG. 4, the substrate/buffer layers 74a and 74b are not present on double HTS layer wire 100 due to the exfoliation process as shown on FIG. 3. As a result, the $I_c$ of the double layer HTS wire 100 constructed with the same lamina dimensions and same HTS insert width as a non-exfoliated wire 70 is doubled. The thickness of the double HTS layer wire 100 is reduced by the difference of the thicknesses of the substrate and buffer layer(s) for each HTS layer 74a and 74b plus the thickness of two lamina layers and the thickness of the stabilizer layer 70. This, therefore, produces an increase in the engineering current density, $J_e$, of the double HTS layer 100 relative to such a standard single HTS layer non-exfoliated wire. Also of significant note, by eliminating the ferromagnetic substrates from the final wire product, electrical performance issues associate with wires utilizing ferromagnetic magnetic substrates are eliminated.

Figure 5:
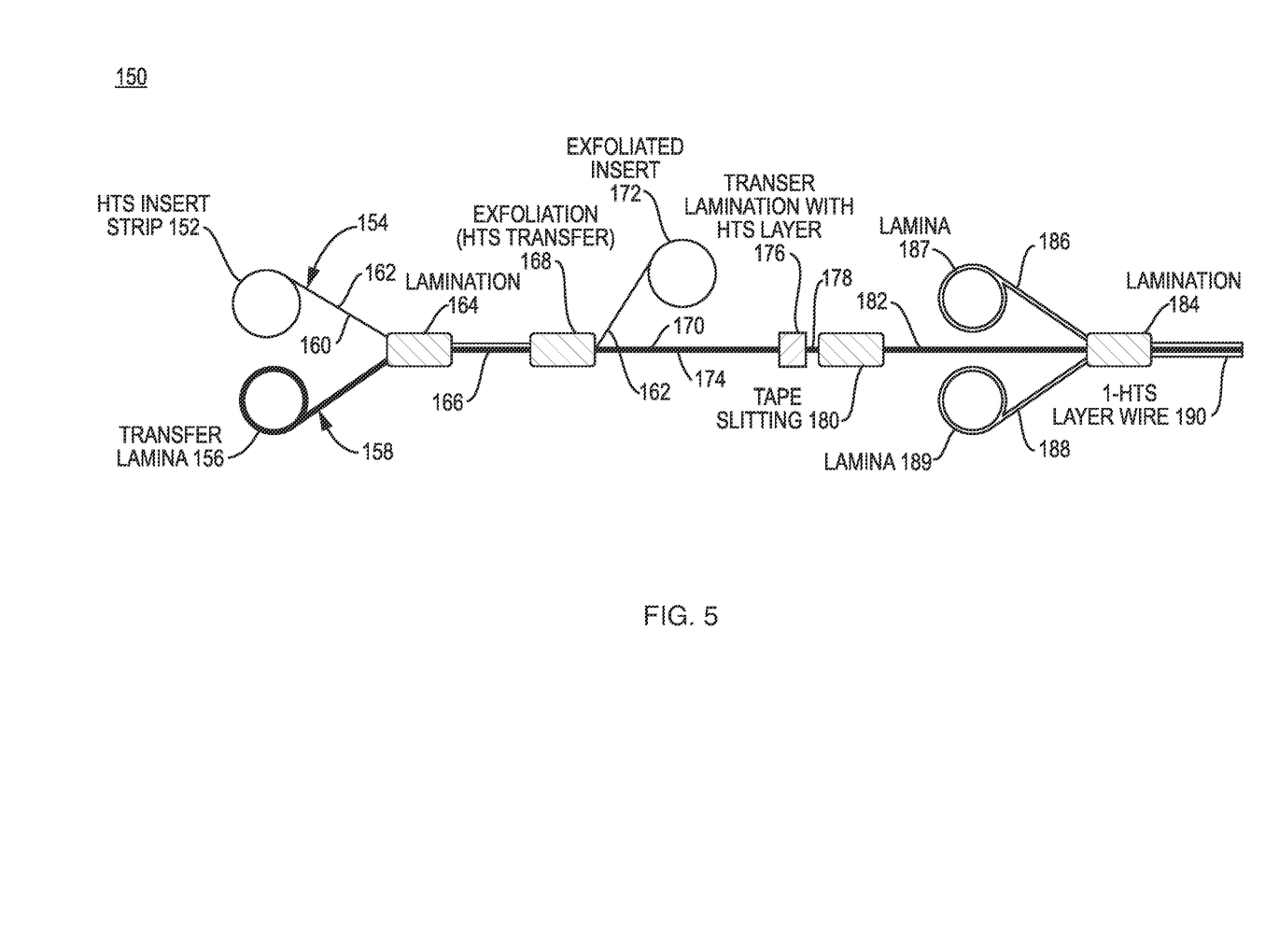
FIG. 5 illustrates a reel to reel process for manufacturing a single sided HTS wire according to another embodiment of this invention.

A standard HTS wire, comprised of a 10 mm wide HTS insert containing a 1.2 μm thick HTS layer, a 75 μm thick substrate, a 150 nm thick buffer layer, and lamina with dimensions of 12×0.05 mm, has a minimum critical current ($I_c$) of about 350 A at 77K, self-field. This results in a minimum $J_e$ of about 155 A/mm². The new double layer wire 100, FIG. 4, produced from the same starting HTS insert and lamina along with a 25 nm thick stabilizer strip can have a minimum $I_c$ of about 700 A at 77K, self-field. This results in an increase in the minimum $J_e$ to about 400 A/mm². In FIG. 5, there is shown a continuous reel to reel process 150 according to an another embodiment of this invention which includes a single reel 152 carrying HTS insert wire 154, which may be comparable to the HTS insert wire described above with regard to FIG. 1. It should be noted that while process 150 is shown to be a continuous process, the process could alternatively be carried out using two or more individual steps. There is an additional reel 156 which carries stabilizer material 158. In one embodiment, the stabilizer material 158 may include any suitable metal containing material and may have a thickness greater than 25 μm. In another embodiment the stabilizer may have a thickness of 10 to 25 μm. In one embodiment the stabilizer is copper. In other embodiments, stabilizer layer 158 comprises a metal selected from the group of aluminum, copper, silver, nickel, iron, stainless steel, aluminum alloy, copper alloy, silver alloy, nickel alloy, and iron alloy.

HTS insert wire 154 is paid off reel 152 so that its cap layer 160 is facing the top surface of stabilizer material 158. The surface opposite of the cap layer 160 is substrate 162 of HTS insert wire 154. The substrate 162 may also include one or more buffer layers. The HTS insert wire 154 on one side of stabilizer 158 4 are fed through a joining machine 164 which joins the HTS insert 154 to the stabilizer 158 via a thin layer of a Sn based solder material to produce a single sided HTS wire structure 166.

In another embodiment a thin epoxy, which may be doped with material to make it electrically conductive, thermally conductive, or electrically and thermally conductive, is used to bond the HTS insert 154 to the stabilizer 158 to produce a single sided HTS wire structure 166.

The single sided HTS wire structure 166 is introduced to exfoliation device 168 causing the substrate layer 162, including buffer layers, to be released or exfoliated from the HTS wire 152, exposing HTS layer 170. The exfoliated substrate 162 is collected on reel 172 as part of the continuous process 150 leaving composite wire structure 174. Composite wire structure 174 includes cap layer 160 affixed to the stabilizer 158 and HTS layer 170 exposed and facing outwardly from the stabilizer layer 158. It should be noted that the exfoliated buffered substrate 162 may be reused as templates to grow new HTS layers thereon and HTS wires with the previously used and exfoliated substrate may be fed through the continuous process 150 to be once again exfoliated so that HTS wires according to this invention may be produced. In one embodiment the top biaxially textured oxide buffer layer 14 may be redeposited on the metal substrate 16 before it is used as a template to grow a new HTS layer. In one embodiment the top buffer layer 14 is $CeO_2$.

Composite wire structure 174 is fed into a metallic bath 176 to produce a cap layer on top of HTS layer 170. The cap layer may each comprise silver or a silver alloy or a silver layer and copper layer. In the case of a layer of silver in combination with a layer of copper, two separate baths would be used. An example of a silver layer and a copper layer is shown in prior art FIG. 1, as silver layer 18a combined with copper layer 20a.

An optional step in the process is an ion irradiation step 48, FIG. 2, which may be used to produce a uniform distribution of pinning microstructures in the HTS layer to improve electrical performance, in particular in applied magnetic fields. In one embodiment the ion irradiation step 48 may be introduced before the deposition of the silver or silver alloy layer 170. In an alternate embodiment the ion irradiation step 48 may be introduced after the deposition of the silver or silver alloy layer 170.

Composite wire structure 178 with a cap layer is fed to wire slitter 180, which slits wire structure 178 using a laser slitter, for example, into a plurality of individual narrower HTS wires 182 that are fed into lamination device 184. Lamination device 184 disposes a lamination layers 186 and 188 fed from reels 187 and 189, respectively, on the upper and lower surfaces of the slit HTS wires 182 to form a plurality of composite single sided HTS layer wires 190.

In one embodiment, lamination device 184 is a solder bath which provides a layer a solder to adhere the laminations to composite wire structure 182. It should be noted that lamination layers may each comprise a metal selected from the group of aluminum, copper, silver, nickel, iron, stainless steel, aluminum alloy, copper alloy, silver alloy, nickel alloy, and iron alloy. Also, the lamination layers may have a width that is greater than the HTS layers by between 0.01 and 2 mm.

In an alternative embodiment, lamination device 184 adheres lamination layers 186/188 to their respective cap layer via an epoxy, which may be doped with material to make the epoxy electrically conductive, thermally conductive, or electrically and thermally conductive.

Figure 6:
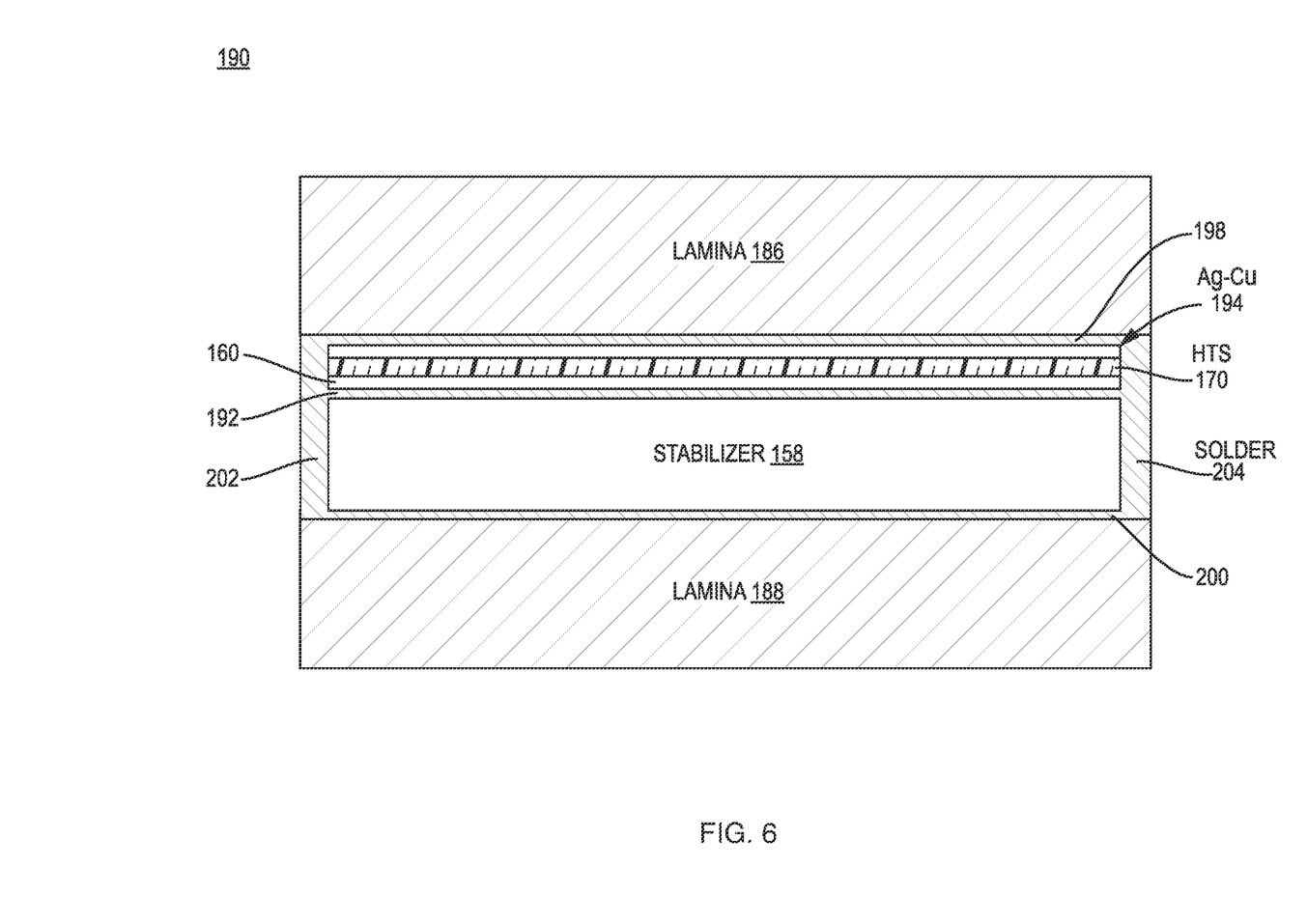
FIG. 6 is a cross-sectional view of a single sided HTS wire manufactured according to the reel to reel process of FIG. 5.

A transverse cross-section schematic of single sided HTS layer wire 190 is shown in FIG. 6 to include a first silver/copper cap layer 160 of HTS layer 170 adhered to the upper surface of stabilizer 158 by solder or epoxy layer 192. Also shown is a second silver/copper cap layer 194 on HTS layer 170. Cap layer 194 is adhered to lamination 186 by solder or epoxy layer 198. On a second surface, opposite the first surface of stabilizer 158, lamination 188 is affixed thereto by solder or epoxy layer 200. During the lamination process by lamination device 184, FIG. 5, solder or epoxy fillets 202 and 204 are disposed along the length and edges of each of the plurality of wires 190 mechanically and electrically connecting the laminations 186 and 188.

As is evident from FIG. 4, the substrate/buffer layers 162 is not present on single sided HTS layer wire 190 due to the exfoliation process as shown on FIG. 5. As a result, the thickness of the single sided HTS layer wire 190 is reduced by the difference between the substrate and buffer layer(s) thickness and the stabilizer layer thickness. For a substrate and buffer layer thickness of about 75 μm and a stabilizer layer thickness of about 25 μm this amounts to a thickness reduction of 50 μm. This, therefore, produces an increase in the engineering current density, $J_e$, of the single sided HTS layer 190 relative to such a single sided layer structure using non-exfoliated wire using the same lamina dimensions up to as much as [[non-exfoliated HTS wire thickness]/[non-exfoliated HTS wire thickness−50 μm]]×100%. Also, as described above, by eliminating the substrate in the final wire product, in wires normally utilizing magnetic substrates electrical performance issues associated with magnetic substrates are overcome.

A standard HTS wire, comprised of a 4 mm wide HTS insert containing a 1.2 μm thick HTS layer, a 75 μm thick substrate and a 150 nm buffer layer, and lamina with dimensions of 4.4×0.15 mm, can have a minimum critical current ($I_c$) of 150 A at 77K, self-field. This results in a minimum $J_e$ of 85 A/mm². The new single layer 190, FIG. 6, produced from the same starting HTS insert and lamina along with a 25 nm thick stabilizer strip can have an $I_2$ of 150 A. This results in a minimum $J_e$ of about 100 A/mm².

While preferred embodiments of the present invention have been shown and described herein, various modifications may be made thereto without departing from the inventive idea of the present invention. Accordingly, it is to be understood the present invention has been described by way of illustration and not limitation. Other embodiments are within the scope of the following claims.

What is claimed is:

1. A method of making a laminated superconductor wire, the method comprising the following steps:
    a) providing a superconductor insert having a first high temperature superconductor layer with a first surface and a second surface opposite the first surface, the first surface overlaying and in direct contact with a surface of a biaxially textured substrate, and a first electrically conductive cap layer overlaying and in direct physical contact with a second surface of the first high temperature superconductor layer;
    b) affixing the first electrically conductive cap layer of the superconductor insert to a first surface of a stabilizer layer;
    c) removing the biaxially textured substrate from the first the high temperature superconductor layer to expose the first surface of the first high temperature superconductor layer;
    d) collecting on a reel the removed biaxially textured substrate;
    e) affixing a second electrically conductive cap layer to the first surface of the first high temperature superconductor layer;
    f) affixing a first lamination layer to the second electrically conductive cap layer; and affixing a second lamination layer to a second surface of the stabilizer layer; wherein the step of affixing the first and second lamination layers includes disposing a first fillet along a first edge of the laminated superconductor wire assembly and connected to the first lamination layer and the second lamination layer and disposing a second fillet along a second edge of the laminated superconductor wire assembly and connected to the first lamination layer and the second lamination layer; and
    g) reusing the reel of biaxially textured substrate removed from the first high temperature superconductor layer in step d) to deposit, using a reel to reel process, a second high temperature superconductor layer with a surface overlaying and in direct contact with the surface of the removed biaxially textured substrate.

2. The method of claim 1, wherein the first and second high temperature superconductor layers comprises a rare earth-alkaline earth-copper oxide.

3. The method of claim 1, wherein the biaxially textured substrate comprises one of a hastelloy or a nickel alloy.

4. The method of claim 3, wherein the biaxially textured substrate further comprises at least one buffer layer.

5. The method of claim 1, wherein the first and second electrically conductive cap layers each comprise silver or a silver alloy or a layer of silver and a layer of copper.

6. The method of claim 1, wherein the first and second lamination layers each comprise a metal selected from the group of aluminum, copper, silver, nickel, iron, stainless steel, aluminum alloy, copper alloy, silver alloy, nickel alloy, and iron alloy.

7. The method of claim 1, wherein the first and second lamination layers have a width that is greater than the width of the first high temperature superconductor layer.

8. The method of claim 7, wherein the width of the first and second lamination layers are between 0.01 and 2 mm greater than the width of the first high temperature superconductor layer.

9. The method of claim 1, wherein the stabilizer layer comprises a metal selected from the group of aluminum, copper, silver, nickel, iron, stainless steel, aluminum alloy, copper alloy, silver alloy, nickel alloy, and iron alloy.

10. The method of claim 1, wherein the second electrically conductive cap layer is affixed to the first surface of the stabilizer layer via an epoxy or solder, the first lamination is bonded to the first electrically conductive cap layer via an epoxy or solder, and the second lamination is bonded to the second with the second surface of the stabilizer layer via an epoxy or solder; and wherein the first and second fillets are formed of an epoxy or a solder.

* * * * *